United States Patent [19]

Shidara et al.

[11] 4,040,985

[45] Aug. 9, 1977

[54] PHOTOCONDUCTIVE FILMS

[75] Inventors: Keiichi Shidara, Tama; Naohiro Goto, Machida; Eiichi Maruyama, Kodaira; Tadaaki Hirai, Koganei; Tsutomu Fujita, Mobara, all of Japan

[73] Assignees: Hitachi, Ltd.; Nippon Hoso Kyokai, both of Japan

[21] Appl. No.: 674,086

[22] Filed: Apr. 6, 1976

[30] Foreign Application Priority Data

Apr. 16, 1975 Japan ................................ 50-45198

[51] Int. Cl.[2] ........................................... H01L 31/00

[52] U.S. Cl. .................................. 252/501; 313/385; 313/386; 427/83; 428/457

[58] Field of Search ................ 252/501; 313/385, 386; 96/1.5; 428/457; 427/83, 124

[56] References Cited

U.S. PATENT DOCUMENTS

| | | | |
|---|---|---|---|
| 3,655,377 | 4/1972 | Sechak | 96/1.5 |
| 3,769,010 | 10/1973 | Hanada et al. | 252/501 X |
| 3,890,525 | 6/1975 | Hirai et al. | 313/386 |
| 3,904,408 | 9/1975 | Hanada et al. | 96/1.5 |

*Primary Examiner*—Benjamin R. Padgett
*Assistant Examiner*—E. Suzanne Parr
*Attorney, Agent, or Firm*—Craig & Antonelli

[57] ABSTRACT

A photoconductive film comprises a first region containing Se in which Te and an element capable of forming deep levels in Se are added at concentrations lower than 10 atomic % inclusive on average, respectively, a second region disposed on the first region and containing Se in which Te is added with a continuous distribution of concentration having a peak value greater than 15 atomic % inclusive, a third region disposed on the second region and containing Se in which an element capable of forming deep levels in Se is added with a continuous distribution of concentration having a peak value greater than 15 atomic % inclusive, and a fourth region disposed on the third region and containing Se in which Te and an element capable of forming deep levels in Se are added at concentrations lower than 10 atomic % inclusive on average, respectively.

3 Claims, 5 Drawing Figures

PHOTOCONDUCTIVE FILMS

BACKGROUND OF THE INVENTION

1.Field of the Invention

The present invention relates in general to a photoconductive film adapted for use in a target of a photoconductive image pick-up tube. More particularly, the invention relates to an improved structure of the photoconductive film of a rectifying contact type having an enhanced sensitivity for red light which is substantially free from drawbacks such as variations in light sensitivity and after-image caused by a long and continuous use of the image pick-up tube incorporating therein such photoconductive film.

2. Description of the Prior Art

It is well known that amorphous selenium exhibits photoconductivity, has a p-type conductivity, and is capable of forming a rectifying contact when contacted with a material having an n-type conductivity. By making use of such properties, a photoconductive target film of the rectifying contact type can be advantageously manufactured from amorphous selenium. However, selenium has a drawback that its sensitivity for long wavelengths is inherently very low. With a view to eliminating such drawback, it is known to add tellurium (Te) to the photoconductive film of selenium(Se). However, the addition of Te to the Se film will often cause a reduction in the carrier mobility and impair the characteristic desired for the target of the image pick-up tube. In order to overcome such undesirable situation, it has already been proposed to add Te only to a part of the photoconductive film as is taught in U.S. Pat. No. 3,890,525.

The target of the image pick-up tube disclosed in U.S. Pat. No. 3,890,525 is composed of a transparent base plate, a transparent electrode made of thin oxide, indium oxide, titanium oxide or the like or a mixture thereof and a photoconductive film of Se, As and Te, wherein the rectifying contact is formed between the transparent electrode and the photoconductive film. In the photoconductive film, As is distributed uniformly along the direction of the thickness of film with a concentration of 10 atomic %. On the contrary, the concentration distribution of Te is nonuniform in such a manner tht Te is dispersed with a concentration lower than 10 atomic % in the interface region between the photoconductive film and the transparent electrode and, as the distance from the transparent electrode increases, the concentration of Te is progressively increased to attain a maximum value of 10 to 40 atomic % and again decreased to 10 atomic %. The maximum concentration of Te is located between the transparent electrode and the middle portion of the photoconductive film. The distribution of Te in such pattern does not impair the property of Se but provides an advantage that the sensitivity of the target to red light is enhanced.

However, it has been found that, with the above described structure of the target, signal current will undergo undesirable variation when the target has been operated continuously for a long time, illuminated by a long wavelength light, or a so-called after-image is stressed when one and the same object have been continuously picked up.

SUMMARY OF THE INVENTION

An object of the present invention is to provide an improved structure of a target for a photoconductive image pick-up tube which is free from the aforementioned drawbacks, that is, the variation in the signal current and the after-image problem due to the continuous operation of the target for a long duration.

To this end, the invention proposes to enhance the sensitivity of a photoconductive film mainly of Se to long wavelength light by providing such a composition that only Te is added into Se at an intermediate region which has to contain additive elements with a high concentration, while, in other regions, a part of Te is replaced by elements other than Te which are capable of forming deep levels in Se.

In more detail, according to one aspect of the invention, there is provided a photoconductive film which comprises sequentially as viewed from the transparent electrode a first region mainly of Se having a thickness greater than 100 A (angstrom) in which the quantities of added Te and an additive element capable of forming a deep level in Se are, respectively, of a concentration not more than 10 atomic % on an average, a second region mainly of Se having a thickness in a range of 200 to 5,000 A in which the peak of continuous distribution of the concentration of the added Te is not less than 15 atomic %, a third region mainly of Se having a thickness in a range of 500 to 3,000 A in which the additive element capable of forming deep levels in Se has a peak of the continuous distribution of concentration of less than 15 atomic %, and a fourth region mainly of Se in which the quantities of Te and the element capable of forming deep levels in Se are selected to be not more than 10 atomic % on an average, respectively.

The present invention starts from the fact that, although the element added to the intermediate region of the photoconductive film having a high concentration of Te should be indispensably Te in order to enhance the sensitivity for red light of the photoconductive film for the target of the image pickuptube disclosed in U.S. Pat. No. 3,890,525, the elements added to the regions lying at both sides of the intermediate region need not necessarily be Te but a part of Te may be replaced by one of elements of the Vb group such as As, Sb and Bi, or one of elements of the IV group such as Si and Ge, or one of compounds or mixtures containing at least one of the above elements which can form deep levels in Se. Surprisingly, it has been found that the substitution of these elements capable of forming deep levels for Te brings about the advantage that variation in the signal current is suppressed to a negligible degree even after a long and continuous operation of the image pick-up tube provided with a target according to the invention and besides, the after-image can be significantly reduced.

Physical mechanism of the above advantageous effects can not be yet fully explained. However, it is believed that, by adding the elements capable of forming deep levels in the region more remote from the transparent electrode than the region a high concentration of Te, a part of carriers for carrying photocurrent is trapped thereby to form a fixed space-charge region which serves to suppress the influences due to variations in the space-change in the film during a long and continuous operation of the image pick-up tube.

The above and other objects, novel features and advantages of the invention will become more apparent by examining the following description of preferred embodiments referring to accompanying drawings. It is, however, pointed out that these embodiments merely illustrate the principle of the invention only by way of example and many other modifications and variations are conceivable without departing from the spirit and scope of the invention.

DESCRIPTION OF THE PREFERRED EMBODIMENTS

Now, the invention will be described with reference to the drawings.

Embodiment 1

Figure 1:
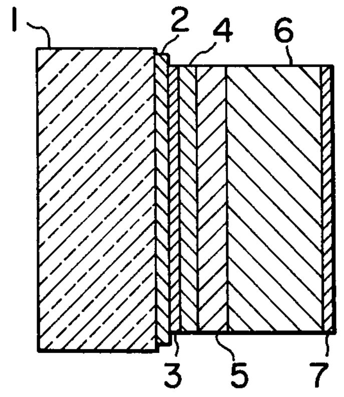
FIG. 1 is a sectional view of a target having a photoconductive film according to the invention.

Referring to FIG. 1 which shows the first embodiment of the invention, a substrate or base plate 1 of glass is provided with a transparent electrode 2 contining tin oxide as a main component, on which electrode 2 there is formed a first region 3 of Se in thickness of 100 to 500 A (angstrom) through an evaporation technic. The first region 3 may contain therein Te and other elements which can form deep levels in Se. It is, however, to be noted that the contents of these elements added in the first regions 3 should not exceed the average concentrations of 10 atomic %. Subsequently, a second region 4 is deposited by simultaneously evaporating Se, Te and As contained in the respective evaporation boats. The second region 4 contains uniformly Te and has a thickness in the range of 200 to 5,000 A and preferably between 500 and 2,000 A. The concentration of Te is selected to be in the range of 15 to 20 atomic %. The content of As is selected not more than 10 atomic %.

A third region 5 of Se and As is deposited on the second region 4 by the evaporation process. The element added to Se is not limited to As, but any element which is capable of forming deep levels in Se can be employed. The thickness of the third region 5 should lie in the range of 500 to 3,000 A and preferably between 500 and 1,500 A. In the deposition of the third region, Se and $As_2Se_3$ contained in the respective boats may be simultaneously evaporated. In this connection, the evaporation process can be effected in such a manner that the concentration of As is initially as high as at least 15 atomic % and preferably in the range of 15 to 25 atomic % and thereafter progressively decreased to 0 to 10 atomic % towards the end of the evaporation process by controlling electric current heating the evaporation boats. A fourth region of Se is formed on the third region 5 through the evaporation process in such a thickness that the produced film is as a whole 4 $\mu$m thick. The fourth region 6 contains in addition to Te elements which can form deep levels in Se. However, the average contents of these elements should, respectively, be not more than 10 atomic %.

The evaporation process for forming the first to the fourth regions may be carried out in a vacuum of $3 \times 10^{-6}$ Torr. A film 7 of $Sb_2S_3$ is formed on the fourth region 6 in thickness of 1,000 A in the atmosphere of argon at $2 \times 10^{-1}$ Torr. The fourth region 6 serves to reduce the electrostatic capacity of the target, while the $Sb_2S_3$ film 7 functions to facilitate the landing of a scanning electron beam. With a view to preventing the crystalization of amorphous Se, it is preferred to add also As or Ge with a concentration not more than 10 atomic % during the deposition of the first to the fourth regions. Such addition of As or Ge will result in an increased thermal stability of the target. It is noted that the film structure is shown in FIG. 1 to clearly elucidate only the order or sequence of forming the individual regions without paying consideration to the precise dimensional relations among them.

Figure 2:
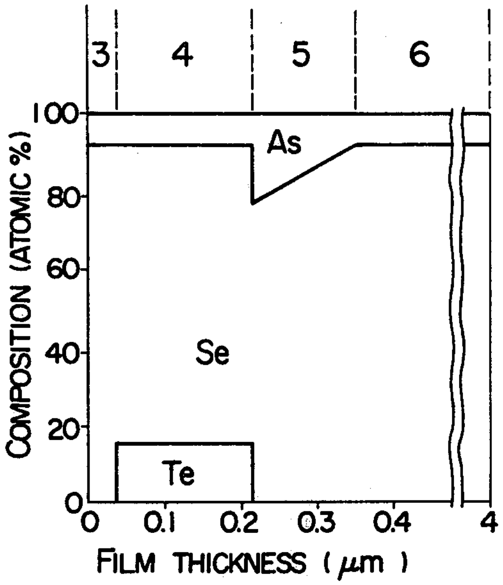
FIG. 2 illustrates distribution of components or elements in the photoconductive film shown in FIG. 1.

FIG. 2 illustrates the distribution of elements in the first to the forth regions 3 to 6 of the photoconductive film according to the invention in which As is used as the additive element to form the deep levels. The first region is indispensably required for forming a rectifying contacted when contacted with the transparent electrode 2 of n-type conductivity. In order to accomplish a stable rectifying contact, the concentration of Te in this region must not exeed 10 atomic %. Furthermore, the concentration of the element such as As and Ge added for enhancing the thermal stability should not be greater than 10 atomic % on an average. The thickness of this region has to be greater than 100 A. The second region 4 containing Te contributes to the enhanced sensitivity of the photoconductive film for red light. In order to obtain a sufficient sensitivity in the visible spectral range, the peak of the continuous distribution of concentration of Te has to be not less than 15 atomic % and most preferably in the range of 20 to 40 atomic %. The thickness of this region should also be between 200 and 5,000 A. In the embodiment shown in FIG. 2, the distribution of concentration of Te in the second region 4 is uniform and shown as having a rectangular distribution pattern. However, the distribution of concentration of Te is not restricted to the rectangular profile. It may be in a triangular, trapezoidal, semicircular or any other much more complicated pattern. What is indispensably important is that Te is added in this region and that the peak of the continuous distribution of concentration of Te is not less than 15 atomic %. The third region 5 shown in FIG. 2 which contains the additive element capable of forming deep levels, say, As in this embodiment serves to reinforce the effect of enhancing the sensitivity for red light made by Te of the second region and simultaneously to suppress the variation in the signal current due to a long use of the image pick-up tube. In order to obtain the most effective action of the additive element forming deep levels, the peak of the continuous distribution of the concentration thereof should be not less than 15 atomic %. The profile of the distribution of the concentration of the additive element forming the deep levels in this region should desirably be so selected that the highest concentration is attained in the interface area in contact with the second region 4 and smoothly decreased with increasing distance from the interface in the thickness range between 500 and 3000 A. When the same element (As) as the one added to the p-type photoconductive film 6 to increase the thermal stability is employed as the element for forming the deep levels in the third region 5 shown in FIG. 2 as in the case of the present embodiment, it is desirable from the practical standpoint that the concentration of the element, say As, should be equal to each other at the interface between the region 5 and the p-type photoconductive region 6.

Figure 3:
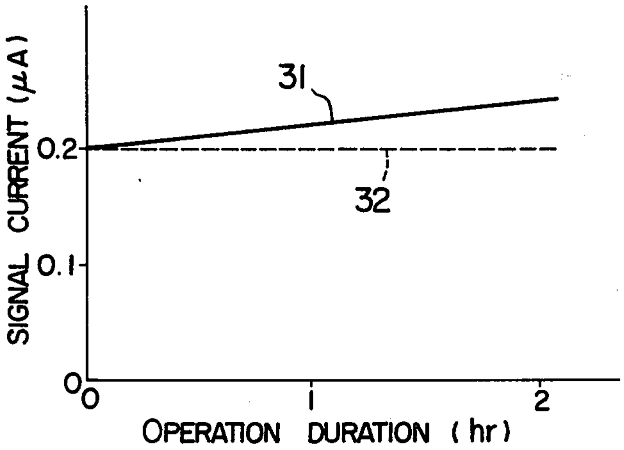
FIG. 3 graphically illustrates variations in the signal current in an image pick-up tube incorporating a photoconductive film according to the invention in comparison with a tube of the prior art.

FIG. 3 illustrates a variation in the signal current available in the target of the image pick-up tube according to the invention in comparison with that of the image pick-up tube disclosed in U.S. Pat. No. 3,890,525, both targets being operated for a long time duration under the same operating conditions. In the case of the target of the prior art, the variation of the signal current amounts to about 20 % after operation over two hours as indicated by a solid curve 31. On the other hand, the signal current variation in the target of the structure according to the invention is smaller than 2 % after 2 hour's operation as indicated by the dashed line curve 32 in FIG. 3. The after-image which is believed to be ascribable to the signal current variation can also be remarkably suppressed in the target according to the invention.

Embodiment 2

A glass substrate or base plate is provided with a light transmissive or transparent electrode of tin oxide, and on the latter there is formed a thin film of CdSe of 200 A thick through an evaporation process. The film of CdSe is deposited by evaporation under vacuum in the order of $5 \times 10^{-6}$ Torr at a substrate temperature of 200° and used as an n-type photoconductive film. Se and Te are simultaneously evaporated on the n-type photoconductive film under vacuum in the order of $3 \times 10^{-6}$ Torr from the respective evaporation boats with the substrate being maintained at room temperature. The evaporation process is so controlled that the concentration of Te is initially in the range of 0 to 5 atomic % and thereafter smoothly increased to attain a concentration of 20 to 25 atomic % at the film thickness of 1,000 A.

Subsequently, simultaneous deposition of Se and Ge is carried out under vacuum in the order of $3 \times 10^{-6}$ Torr from the respective evaporation boats. The deposition is so controlled that the initial concentration of Ge lies in the range between 20 and 25 atomic % and thereafter decreased progressively and smoothly to 0 to 10 atomic % at the film thickness of 500 to 1500 A. On the film of Se and Ge there is then deposited an Se film containing 5 atomic % of Ge through evaporation. The whole thickness of the film structure inclusive of the Cd Se layer is selected to be about 5 $\mu$m.

Finally, an $Sb_2S_3$ layer of 1,000 A thick is deposited on the above film structure through the evaporation process in an argon atmosphere of $3 \times 10^{-1}$ Torr to make a target for the image pick-up tube. In this second embodiment, the CdSe layer or film contacts with the p-type photoconductive film containing Se, Ge and Te to form a rectifying contact. Due to the presence of the film of CdSe, the tendency of the film of Se, Ge and Te becoming crystalized is suppressed and at the same time the sensitivity for red light can further be increased. To the same effect, sulfides, selenates and tellurates of Zn and Cd or mixture thereof may be employed in place of CdSe.

The aforementioned second embodiment is different from the first embodiment shown in FIG. 1 in that the n-type transparent electrode 2 is divided into two sections, one of which serves as the electrode,while the other section functions as the n-type photoconductive film. Further, in the case of the second embodiment, the region containing Te may be considered to be contiguously extending through the first and the second regions 3 and 4 with the concentration thereof varying continuously across these regions.

It is certainly desirable that elements added to Se such as Te, As and Ge have a distribution of concentration which is continuous along the direction of the thickness of the photoconductive film. However, this is a requirement from a macroscopical viewpoint. For example, even if an abrupt variation in the concentration distribution is microscopically found in a range smaller than 100 angstroms, the distribution can be still regarded as continuous or effectively continuous from the macroscopical standpoint so long as the concentration distribution is smooth as a whole over a range in the order of several hundreds angstroms. It is known that a continuous distribution in the macroscopical sense is sufficient for preventing degradation of the characteristics of the imge pick-up tube (refer to U.S. Pat. No. 3800194). This also applies to the present invention. Accordingly, also in the present invention it is sufficient to control the concentrations of such elements as Te, As and Ge with the continuity of the distribution being determined from the macroscopical standpoint.

In the photoconductive film according to the invention, it is possible to manufacture a photoconductive composite film having a desired component ratio or macroscopically continuous distribution of the components by cyclically superposing several thousands of thin films each having the thickness of several or several tens of angstroms onto one another on a base plate through an evaporation process utilizing a rotating evaporation apparatus provided with a plurality of evaporation sources such as Se, $As_2Se_3$, Te or Ge.

In the above description "the continuous distribution" means a distribution representing variations in averaged concentration of component elements in each composite film formed by one cycle of the rotating process.

Embodiment 3

Figure 4:
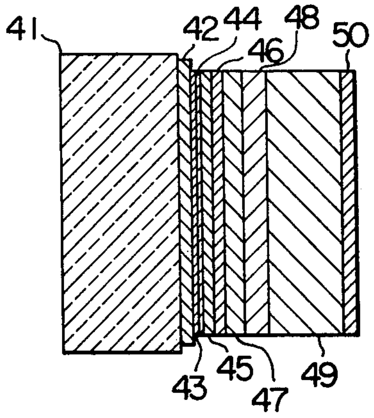
FIG. 4 is a sectional view of a target incorporating a photoconductive film according to another embodiment of the invention.
Figure 5:
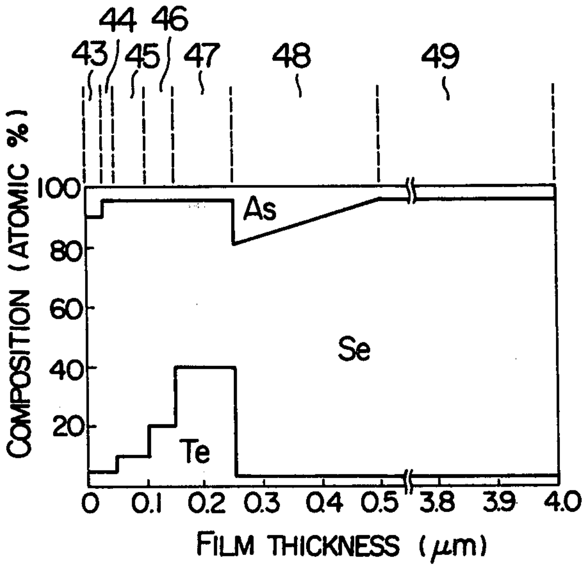
FIG. 5 illustrates distribution of various elements in the photoconductive film shown in FIG. 4.

FIG. 4 shows a third embodiment of the photoconductive film according to the invention. A structure shown in FIG. 4 comprises a glass substrate 41, an n-type transparent electrode 42 mainly of tin oxide deposited on the substrate or base plate 41, a layer 43 of 300 A thick deposited on the transparent electrode 42 and containing 5 atomic % of Te, 10 atomic % of As and 85 atomic % of Se, a layer 44 of 200 A thick deposited on the layer 43 and containing 5 atomic % of Te, 4 atomic % of As and 91 atomic % of Se, a layer 45 of 500 A thick containing 10 atomic % of Te, 4 atomic % of As and 86 atomic % of Se, a layer 46 of 500 A thick containing 20 atomic % of Te, 4 atomic % of As and 76 atomic % of Se, a layer 47 of 1000 A thick containing 40 atomic % of Te, 4 atomic % of As and 56 atomic % of Se, a layer 48 of 2,500 A thick containing 2 atomic % of Te, As in a smoothly decreased distribution from 20 atomic % to 4 atomic % and Se in a progressively increased distribution from 78 atomic % to 94 atomic %, and a layer 49 of 3.5 $\mu$m thick containing 2 atomic % of Te, 4 atomic % of As and 94 atomic % of Se. The above various layers are deposited through evaporation in the described order. It is noted that the layers 43, 44 and 45 correspond to the first region 3 of the first embodiment, the layers 46 and 47 correspond to the second region 4, the layer 48 correspond to the third region 5 and the layer 49 corresponds to the fourth region 6 of the first embodiment. The portion corresponding to the first region 3 of the first embodiment has thickness of 1,000

A and contains 7.5 atomic % of Te and 5.8 atomic % of As in averaged concentrations. The portion corresponding to the second region 4 is 1,500 A in thickness and contains Te in the peak amount of 40 atomic %. The portion corresponding to the third region 5 is 2500 A in thickness and contains 20 atomic % of As in the peak quantity. The quantities of Te and As contained in the portion corresponding to the fourth region 6 are 2 atomic % and 4 atomic %, respectively.

On the photoconductive film having the above structure there is finally deposited an $Sb_2S_3$ layer 50 for facilitating the landing of the scanning electron beam through evaporation in an argon atmosphere of $2 \times 10^{-1}$ Torr to make the target, as is in the case of the first embodiment. The photoconductive film according to the third embodiment of the invention has a higher peak value of Te than that of the first embodiment. Further, by virtue of the fact that the distribution profile of Te is formed in a stepwise configuration, light rays having different wavelengths can be absorbed at the different regions of the photoconductive film. This feature provides an excellent advantage that carriers produced by impinging light rays will not be concentrated at a single location and hence can have a long life. The photoconductive film thus can exhibit a high sensitivity over a wide range of wavelengths.

As will be appreciated from the foregoing description, the invention provides an improved target for an image pick-up tube having a p-type photoconductive film contining Se as a main element in which the variation of the signal current as well as the after image ascribable thereto are substantially reduced by forming a region added with elements capable of forming deep levels at the locations adjacent to the region containing Te.

Although the invention has been described by taking the target of an image pick-up tube as an example, it will be understood that the principle of the invention can be equally applied to other photo-sensitive elements and an electrophotographic printing plate.

We claim:

1. A photoconductive film comprising;

a first region having a thickness in a range greater than 100 A and containing Se in which Te and elements capable of forming deep levels in Se are added at concentrations lower than 10 atomic % inclusive on an average, respectively, a second region disposed on said first region, said second region having a thickness in a range between 200 A and 5000 A and containing Se in which Te is added with a continuous distribution of concentration having a peak value greater than 15 atomic % inclusive, a third region disposed on said second region, said third region having a thickness in a range between 500 A and 3,000 A and containing Se in which at least one element capable of forming deep levels in Se is added with a continuous distribution of concentration having a peak value greater than 15 atomic % inclusive, and a fourth region disposed on said third region and containing Se in which Te and at least one element capable of forming deep levels in Se are added at concentrations lower than 10 atomic % inclusive on an average, respectively, said at least one element capable of forming the deep levels in Se being selected from the group consisting of As, Sb, Bi, Se, Ge, and a mixture thereof.

2. A photoconductive film according to claim 1, wherein the concentration of said elements added to said third region to form said deep levels in Se has such a distribution gradient that the concentration of said elements is highest in the vicinity of the interface between said third and second regions and smoothly decreased towards the interface between said third and fourth regions.

3. A photoconductive film according to claim 1, wherein at least one of said regions is made of composite films formed by cyclically superposing plural types of individual homogeneous films, each having a thickness less than 100 A inclusive, the average composition of each composite film being defined by a continuous distribution of concentration.

* * * * *